United States Patent
Ahmad et al.

(10) Patent No.: US 6,397,158 B1
(45) Date of Patent: May 28, 2002

(54) METHOD FOR DETERMINING CAPACITANCE VALUES FOR QUIETING NOISY POWER CONDUCTORS

(75) Inventors: Waseem Ahmad; Kazi M. Hassan, both of Sunnyvale, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/303,103

(22) Filed: Apr. 29, 1999

(51) Int. Cl.$^7$ ............................................. G01R 31/08
(52) U.S. Cl. ........................... 702/76; 702/57; 702/64; 702/77; 702/183
(58) Field of Search ...................... 702/57, 64, 65, 702/66, 69, 71, 75–77, 79, 117, 124, 126, 183, 189, 193, 198, FOR 103–108, FOR 110, FOR 134, FOR 135, FOR 168, FOR 170, FOR 171; 324/674, 681, 76.19, 76.21, 76.75

(56) References Cited

U.S. PATENT DOCUMENTS

| | | | |
|---|---|---|---|
| 3,707,650 A | * 12/1972 | Innis et al. | 317/12 A |
| 3,816,800 A | * 6/1974 | Ringler et al. | 317/12 A |
| 3,944,940 A | * 3/1976 | Desai | 329/122 |
| 4,012,667 A | * 3/1977 | Ishida et al. | 361/16 |
| 4,613,771 A | * 9/1986 | Gal | 307/443 |
| 4,814,691 A | * 3/1989 | Garbini et al. | 324/61 R |
| 5,034,851 A | * 7/1991 | Monsorno et al. | 361/321 |
| 5,262,957 A | * 11/1993 | Hearn | 364/485 |
| 5,463,326 A | 10/1995 | Raje | 326/30 |
| 5,555,148 A | * 9/1996 | Matsuzaki et al. | 361/15 |
| 5,672,997 A | * 9/1997 | Shield | 327/538 |
| 5,686,872 A | 11/1997 | Fried et al. | 333/22 |
| 5,726,583 A | * 3/1998 | Kaplinsky | 326/30 |
| 5,768,109 A | * 6/1998 | Gulick et al. | 361/794 |
| 5,789,964 A | * 8/1998 | Voldman | 327/380 |
| 5,926,032 A | * 7/1999 | Gebara et al. | 326/30 |
| 5,963,023 A | * 10/1999 | Herrell et al. | 323/265 |
| 6,005,394 A | * 12/1999 | Majka et al. | 324/519 |
| 6,054,881 A | 4/2000 | Stoenner | 327/112 |
| 6,075,423 A | * 6/2000 | Saunders | 333/33 |
| 6,114,895 A | * 9/2000 | Stephens | 327/391 |
| 6,137,283 A | * 10/2000 | Williams et al. | 324/76.12 |
| 6,144,210 A | * 11/2000 | Brooks | 324/519 |
| 6,192,496 B1 | * 2/2001 | Lawrence et al. | 714/724 |
| 6,194,903 B1 | * 2/2001 | Schulz | 324/661 |
| 6,195,613 B1 | * 2/2001 | Roy et al. | 702/65 |

\* cited by examiner

Primary Examiner—Marc S. Hoff
Assistant Examiner—Carol S. W. Tsai
(74) Attorney, Agent, or Firm—Sierra Patent Group, Ltd.

(57) ABSTRACT

A method for determining the value of at least one capacitance required to be placed in a conductive path on a printed circuit board is disclosed. The method includes preparing a desired signal spectrum for the conductive path, preparing an actual signal spectrum for the conductive path, and then comparing the actual signal spectrum against the desired signal spectrum to determine where any out of tolerance conditions exist. If the actual signal spectrum is in amplitude versus time form, the method further includes performing, for each time having a voltage which is higher than the maximum voltage allowed on the conductive path, a fourier transform on the amplitude versus time data. Following the optional conversion, the method proceeds with the determination of at least one frequency having an amplitude which significantly contributes to the out of tolerance condition, and computing, for the one or more frequencies contributing to the out of tolerance condition, a value of capacitance which would diminish the amplitude at that frequency to a value which is within tolerance.

2 Claims, 4 Drawing Sheets

METHOD FOR DETERMINING CAPACITANCE VALUES FOR QUIETING NOISY POWER CONDUCTORS

BACKGROUND OF THE INVENTION

1. Field of the Invention

The present invention relates to electronic systems utilizing noisy conductors for delivering power to components mounted on a printed circuit board. More particularly, the present invention relates to a method for determining the value of a capacitance required in order to ensure that a voltage provided to an integrated circuit is within desired tolerances.

2. The Background Art

Modern printed circuit boards have components mounted thereon which require an active power source. The active power source is typically external to the printed circuit board, and supplies power through a connector mounted thereon. Conductive traces which are coupled through the connector to the power source allow the power to be delivered to the proper locations.

Some conductive traces, in addition to performing the intended function of delivering power to various components, unintentionally act as antennas which inductively and capacitively couple signals from other traces. This unintentional coupling of signals is typically undesireable, and in the case of power conductors, results in the fluctuation of power at different frequencies for a given component.

In order to ensure that the supplied power is within desired tolerances, capacitors of various values are placed in the conductive paths between the power supply and the components to which the power is applied, in order to reduce the amplitudes of undesired signals.

FIG. 1 is a block diagram showing a typical placement of capacitors on a printed circuit board.

Referring to FIG. 1, system 10 includes printed circuit board 12, and power source 14. Printed circuit board 12 includes active components 16, 18, 20, 22, 24, and 26, all of which require a power source. Power source 14 supplys power to the listed components through connector 28, along conductive paths 32, 34, 36, 38, and 40.

In order to ensure that power signals on each of conductive paths 32, 34, 36, 38, and 40 are within design specifications for each frequency band, capacitors 42, 44, 46, 48, and 50 are provided. These capacitors have capacitance values which are specifically chosen so that signals which may be unintentionally been coupled to conductive paths 32, 34, 36, 38, and 40 are reduced in amplitude so that the resulting power is within tolerance at a component.

Although only one capacitor is depicted for each conductive path shown in FIG. 1, those of ordinary skill in the art will readily recognize that it is more likely that several capacitors would be present, thus reducing the signal amplitudes associated with more than one frequency band.

Although the prior art method of installing capacitors of various values works for the intended purpose of reducing signal amplitudes in various frequency bands, it is very cumbersome. There is no systematic method used in the prior art to determine the proper values of capacitance which would diminish the amplitude of the undesired signals.

It is therefore desirable to provide a method for determining the proper capacitance values to use in various locations on a printed circuit board, so that the resulting signal amplitudes are within desired tolerances.

SUMMARY OF THE INVENTION

A method for determining the value of at least one capacitance required to be placed in a conductive path on a printed circuit board is disclosed. The method includes preparing a desired signal spectrum for the conductive path, preparing an actual signal spectrum for the conductive path, and then comparing the actual signal spectrum against the desired signal spectrum to determine where any out of tolerance conditions exist. If the actual signal spectrum is in amplitude versus time form, the method further includes performing, for each time having a voltage which is higher than the maximum voltage allowed on the conductive path, a fourier transform on the amplitude versus time data. Following the optional conversion, the method proceeds with the determination of at least one frequency having an amplitude which significantly contributes to the out of tolerance condition, and computing, for the one or more frequencies contributing to the out of tolerance condition, a value of capacitance which would diminish the amplitude at that frequency to a value which is within tolerance.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Figure 2:
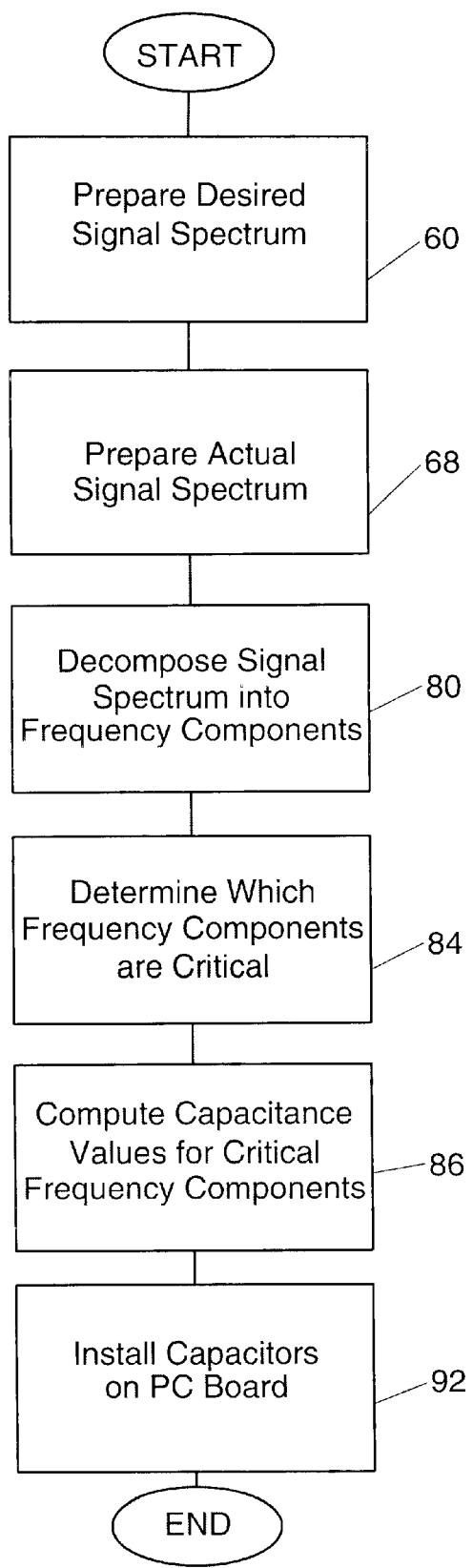
FIG. 2 is a flow chart illustrating steps in one embodiment of the present invention.

FIG. 2 is a flow chart illustrating steps in one embodiment of the present invention.

Figure 1:
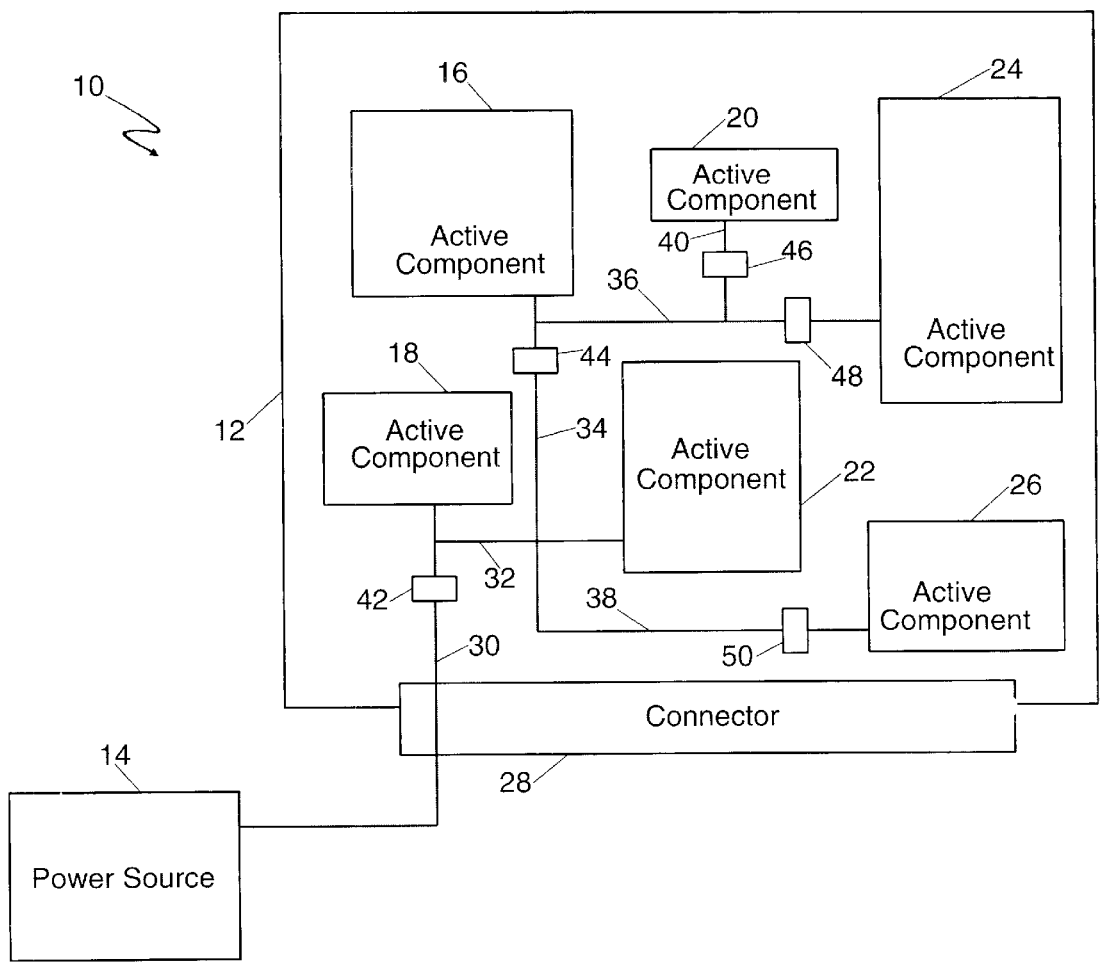
FIG. 1 is a block diagram showing a typical placement of capacitors on a printed circuit board.

Referring to FIG. 2, the method begins at block 60 when a desired power spectrum is prepared. This power spectrum will most often include a nominal voltage and a tolerance, for each of the conductive paths such as paths 32, 34, 36, 38, and 40 of FIG. 1. This information may be provided as a waveshape, or may instead be provided as numerical data which represents an amplitude over time. An example of one possible ideal power spectrum is depicted in FIG. 3.

Figure 3:
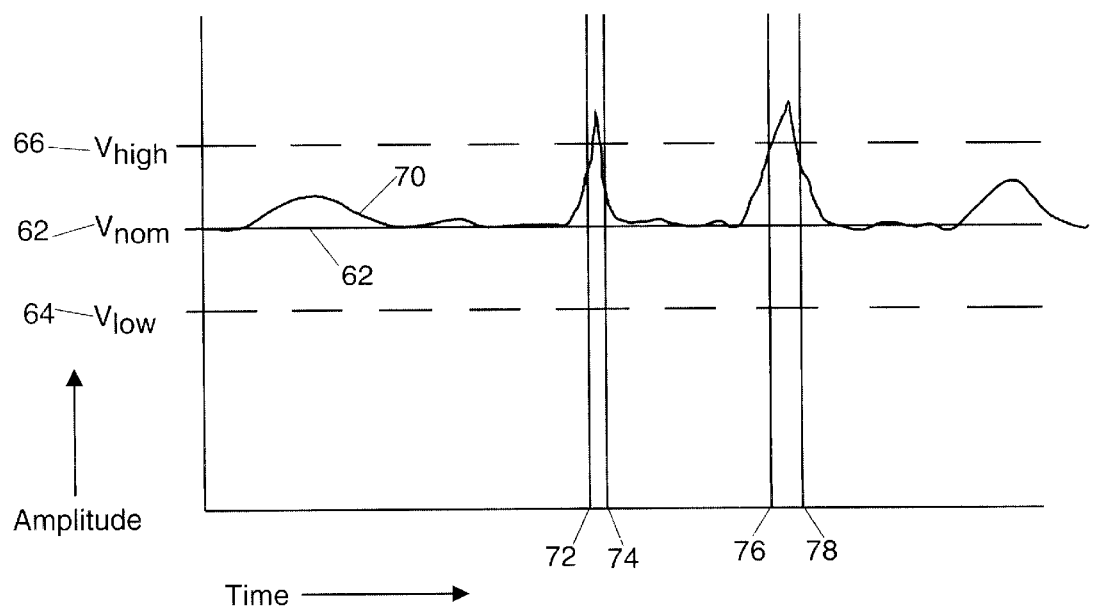
FIG. 3 is a chart showing possible ideal and actual signals expected on a conductive path in amplitude versus time format.

Referring to FIGS. 2 and 3 together, a nominal voltage $V_{nom}$ 62, a minimum voltage $V_{low}$ 64, and a maximum voltage $V_{high}$ 66 are depicted which represent the desired voltage range over time, for one of the conductive paths 32, 34, 36, 38, or 40 on printed circuit board 12.

At block 68, the actual signal spectrum for each of the conductive paths is prepared, resulting in a signal such as the example actual signal 70 seen in FIG. 3. Each conductive path may have a different actual and desired signal spectrum, due to the requirements of each individual active component.

At a time 72 and until a time 74 in FIG. 3, the amplitude of the signal is seen to be out of the desired tolerance band defined by $V_{low}$ 64 and $V_{high}$ 66. At time 76 and until time 78, a second instance of the power spectrum being out of desired limits is seen.

At block 80 in FIG. 3, for each of the out of tolerance conditions that is critical, a fourier transform is performed.

As is known to those of ordinary skill in the art, a fourier transform performed on a signal which has been presented as amplitude vs. time will result in a signal that is presented as amplitude vs. frequency for the given time period for which the fourier transform was performed.

Figure 4:
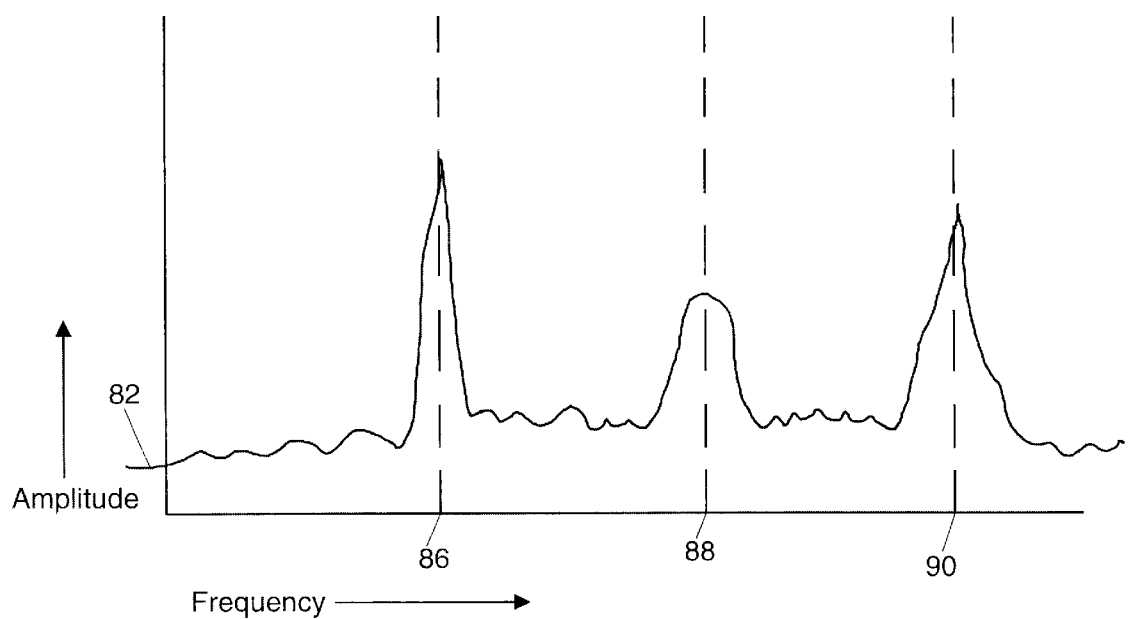
FIG. 4 is a chart depicting an actual signal expected on a typical conductive path in amplitude versus frequency format.

For example, if a fourier transform is performed on the FIG. 3 signal for the time period defined between time 72 and time 74, the signal 82 of FIG. 4 might result. At block 84 of FIG. 2, it is determined which frequencies within signal 82 are responsible for the out of tolerance condition.

Referring to FIG. 4, three different center frequencies 86, 88, and 90 are seen to have possible significant contribution to the out of tolerance condition previously seen between times 72 and 74 in FIG. 3. Since the most significant contributions to the high amplitude appear at frequencies 86 and 90, it is desirable to filter those frequencies before filtering the lesser contributing frequency 88.

At block 86, values for capacitors are computed, to attenuate each of the frequencies determined from block 84. One method of computing the values of the capacitance required is to determine the impedance of the power source and set that impedance equal to the capacitive reactance of the required capacitance, at the desired frequency.

For example, if the power supply impedance is $Z_{ps}$, and the value of the capacitor given by the variable C, then $$Z_{ps}=1/(2\pi f_{86}C) \quad (R.\ 1)$$

where $f_{86}$ is defined as the frequency 86 in FIG. 4. Inverting relationship R. 1 provides $$C=1/(2\pi f_{86}Z_{ps}) \quad (R.\ 2)$$

where C is the required capacitance in farads.

Relationship (R. 2) is performed for each of the undesirable frequencies which contribute to the out of tolerance condition.

At block 92, capacitors having values near the values computed using relationship (R. 2) are mounted to the printed circuit board. One or more capacitors may be added for each conductive path having an out of tolerance condition, depending on the specific requirements of the system being designed.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A method for determining the value of at least one capacitance required to be placed in a conductive path on a printed circuit board, the method comprising:

determining a target signal spectrum for the conductive path;

determining an actual signal spectrum for the conductive path;

comparing said actual signal spectrum against said target signal spectrum to determine whether a voltage exists on said conductive path which is higher than a maximum allowed voltage;

performing, if said actual signal spectrum is in amplitude versus time form, for each time having a voltage which is higher than the maximum allowed voltage on said conductive path, a fourier transform on said amplitude versus time data, resulting in amplitude versus frequency data;

determining at least one frequency having an amplitude which significantly contributes to said out of tolerance condition; and computing for at least one of said at least one frequencies, a value of capacitance which would diminish the amplitude of at least one of said at least one frequencies to a value which is within desired tolerances.

2. A machine-readable medium comprising software stored thereon, the software containing instructions which cause a machine to perform a method for determining the value of at least one capacitance required to be placed in a conductive path on a printed circuit board, the method comprising:

preparing a desired signal spectrum for the conductive path;

preparing an actual signal spectrum for the conductive path;

comparing said actual signal spectrum against said target signal spectrum to determine whether a voltage exists on said conductive path which is higher than the maximum allowed voltage;

performing, if said actual signal spectrum is in amplitude versus time form, for each time having a voltage which is higher than the maximum voltage allowed on said conductive path, a fourier transform on said amplitude versus time data, resulting in amplitude versus frequency data;

determining at least one frequency having an amplitude which significantly contributes to said out of tolerance condition; and computing, for each of said at least one frequencies, a value of capacitance which would diminish the amplitude of said at least one frequency to a value which is within desired tolerances.

* * * * *